United States Patent
Oliphant et al.

(10) Patent No.: US 6,483,712 B1
(45) Date of Patent: *Nov. 19, 2002

(54) ILLUMINATING ELECTRICAL JACK SYSTEM

(75) Inventors: David Oliphant, Salt Lake City, UT (US); Brent D. Madsen, Providence, UT (US); Rick Giles, Sandy, UT (US)

(73) Assignee: 3Com Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/528,330

(22) Filed: Mar. 20, 2000

(51) Int. Cl.$^7$ ................................................ H05K 1/14

(52) U.S. Cl. ...................... 361/737; 361/736; 361/752; 439/76.1; 439/490

(58) Field of Search ............................. 361/736, 737, 361/762, 763; 439/490, 676, 76.1, 910; 362/27–32

(56) References Cited

U.S. PATENT DOCUMENTS

| | | | |
|---|---|---|---|
| 2,916,720 A | 12/1959 | Steans | 339/91 |
| 3,500,293 A | 3/1970 | Cocco | 339/113 |
| 4,136,357 A | 1/1979 | Frederiksen | 357/72 |
| 4,186,988 A | 2/1980 | Kobler | 339/176 MP |
| 4,241,974 A | 12/1980 | Hardesty | 339/154 A |
| 4,303,296 A | 12/1981 | Spaulding | 339/122 R |
| 4,352,492 A | 10/1982 | Smith | 273/1 |
| 4,386,818 A | 6/1983 | Millhimes et al. | 339/113 L |
| 4,407,559 A | 10/1983 | Meyer | 339/126 R |
| 4,428,636 A | 1/1984 | Kam et al. | 339/97 P |
| 4,564,728 A | 1/1986 | Romano | 179/175.3 |
| 4,566,769 A | 1/1986 | Johnston | 339/95 D |
| 4,620,070 A | 10/1986 | Ruehl | 179/175.3 |
| D291,071 S | 7/1987 | Breil | D10/78 |
| 4,710,136 A | 12/1987 | Suzuki | 439/374 |
| 4,778,410 A | 10/1988 | Tanaka | 439/676 |
| 4,789,224 A | 12/1988 | Bougsty | 350/345 |
| 4,800,466 A | 1/1989 | Bauer et al. | 362/26 |

(List continued on next page.)

FOREIGN PATENT DOCUMENTS

| | | |
|---|---|---|
| GB | 2214007 A | 8/1989 |
| GB | 2229029 A | 9/1990 |
| GB | 2247118 A | 2/1992 |
| GB | 2247363 A | 2/1992 |
| GB | 2315926 A | 2/1998 |
| GB | 2316816 A | 3/1998 |
| JP | 61-256850 | 11/1986 |
| WO | WO 95/13633 | 5/1995 |

OTHER PUBLICATIONS

P.E. Knight and D.R. Smith "Electrical Connector for Flat Flexible Cable," IBM Technical Disclosure Bulletin, vol. 25, No. 1, Jun. 1982.

*Primary Examiner*—David L. Talbott
*Assistant Examiner*—Tuan Dinh
(74) *Attorney, Agent, or Firm*—Workman, Nydegger & Seeley

(57) ABSTRACT

An electrical jack system is operable with an electrical plug, such as an RJ-type plug. In one embodiment, the electrical plug is at least partially translucent. The jack system includes a housing bounding a socket. The socket is configured to receive the electrical plug. A light source is coupled with the housing so as to selectively illuminate the socket and/or the translucent electrical plug when the translucent electrical plug is received within the socket of the housing. In one embodiment, the light source is a light emitter, such as an LED, mounted on the housing so as to be at least partially exposed to the socket of the housing. In an alternative embodiment, an opening is formed on the housing in communication with the socket. A light emitter is disposed a distance from the opening on the housing. A conduit extends between the light emitter and the opening. The conduit, such as a light pipe, is configured to channel light from the light emitter to the opening on the housing.

25 Claims, 3 Drawing Sheets

U.S. PATENT DOCUMENTS

| | | | |
|---|---|---|---|
| 4,887,876 A | 12/1989 | Fricke et al. ............... 350/96.2 |
| 4,915,648 A | 4/1990 | Takase et al. ............... 439/490 |
| 4,978,317 A | 12/1990 | Pocrass ..................... 439/490 |
| 5,035,641 A | 7/1991 | Van-Santbrink et al. .... 439/329 |
| 5,051,099 A | 9/1991 | Pickles et al. .............. 439/108 |
| 5,062,807 A | 11/1991 | Guss, III .................... 439/440 |
| 5,139,439 A | 8/1992 | Shie ........................... 439/359 |
| 5,183,404 A | 2/1993 | Aldous et al. ................ 439/55 |
| 5,184,282 A | 2/1993 | Kaneda et al. .............. 361/395 |
| 5,319,527 A | 6/1994 | Murphy et al. ............... 362/26 |
| 5,336,099 A | 8/1994 | Aldous et al. .............. 439/131 |
| 5,338,210 A | 8/1994 | Beckham et al. ........... 439/131 |
| 5,345,367 A | 9/1994 | Pierce et al. ................. 362/32 |
| 5,359,165 A | 10/1994 | Leveque et al. ............ 200/317 |
| 5,391,094 A | 2/1995 | Kakinoki et al. ........... 439/638 |
| 5,411,405 A | 5/1995 | McDaniels et al. ......... 439/131 |
| 5,457,600 A | 10/1995 | Campbell et al. ........... 361/643 |
| 5,474,463 A | 12/1995 | Robinson et al. ........... 439/490 |
| 5,481,616 A | 1/1996 | Freadman .................... 381/90 |
| 5,487,123 A | 1/1996 | Fowble ........................ 385/70 |
| 5,499,923 A | 3/1996 | Archibald et al. ............ 439/26 |
| 5,505,633 A | 4/1996 | Broadbent ................. 439/638 |
| 5,509,811 A | 4/1996 | Homic ......................... 439/55 |
| 5,513,373 A | 4/1996 | Damkier .................... 395/836 |
| 5,538,442 A | 7/1996 | Okada ........................ 439/676 |
| 5,547,401 A | 8/1996 | Aldous et al. .............. 439/676 |
| 5,561,727 A | 10/1996 | Akita et al. ................... 385/88 |
| 5,562,504 A | 10/1996 | Moshayedi ................. 439/638 |
| 5,597,227 A | 1/1997 | Bergen et al. .............. 362/100 |
| 5,608,607 A | 3/1997 | Dittmer ..................... 361/686 |
| 5,613,873 A | 3/1997 | Bell, Jr. ..................... 439/490 |
| 5,634,802 A | 6/1997 | Kerlaan ..................... 439/131 |
| 5,645,577 A | 7/1997 | Fröberg et al. ............... 607/37 |
| 5,646,816 A | 7/1997 | Alden et al. ................ 361/622 |
| 5,654,873 A | 8/1997 | Smithson et al. ........... 361/685 |
| 5,660,568 A | 8/1997 | Moshayedi ................. 439/654 |
| 5,667,395 A | 9/1997 | Okada et al. ............... 439/131 |
| 5,668,654 A | 9/1997 | Benjamin et al. ........... 359/152 |
| 5,679,013 A | 10/1997 | Matsunaga et al. ......... 439/144 |
| 5,692,914 A | 12/1997 | Mitani et al. ............... 439/131 |
| 5,697,815 A | 12/1997 | Drewnicki .................. 439/638 |
| 5,704,802 A | 1/1998 | Loudermilk ................ 439/490 |
| 5,727,972 A | 3/1998 | Aldous et al. .............. 439/655 |
| 5,741,152 A | 4/1998 | Boutros ..................... 439/490 |
| 5,759,067 A | 6/1998 | Sheer ......................... 439/607 |
| 5,767,623 A | 6/1998 | Friedman et al. ........... 313/509 |
| 5,773,332 A | 6/1998 | Glad .......................... 439/344 |
| 5,790,041 A | 8/1998 | Lee ............................ 439/490 |
| 5,797,771 A | 8/1998 | Garside ...................... 439/610 |
| 5,816,832 A | 10/1998 | Aldous et al. .............. 439/131 |
| 5,876,239 A | 3/1999 | Morin et al. ................ 439/490 |
| 5,885,100 A | 3/1999 | Talend et al. ............... 439/490 |
| 5,915,060 A | 6/1999 | Kerskey et al. ............. 385/133 |
| 5,915,993 A | 6/1999 | Belopolsky et al. ........ 439/490 |
| 5,938,324 A | 8/1999 | Salmon et al. .............. 362/555 |
| 5,967,817 A | 10/1999 | Greenstein ................. 439/205 |
| 5,971,558 A | 10/1999 | Peel ............................. 362/26 |
| 6,062,908 A | 5/2000 | Jones ......................... 439/620 |
| 6,075,215 A | 6/2000 | Bollinger, Jr. et al. ...... 200/317 |
| 6,095,851 A * | 8/2000 | Laity et al. ................. 439/490 |
| 6,113,422 A * | 9/2000 | Somerville et al. ......... 439/490 |
| 6,116,962 A | 9/2000 | Laity ......................... 439/676 |
| 6,217,391 B1 * | 4/2001 | Colantuono et al. ........ 439/676 |
| 6,224,417 B1 * | 5/2001 | Belopolsky et al. ........ 439/490 |

* cited by examiner

ILLUMINATING ELECTRICAL JACK SYSTEM

BACKGROUND OF THE INVENTION

1. The Field of the Invention

The present invention relates to electrical jacks and, more specifically electrical jacks having an illuminated socket configured to receive an electrical plug.

2. Description of Related Art

Electrical apparatus, such as computers, personal information managers, PC cards, and the like, are often formed with one or more of a variety of different types of electrical jacks. One conventional type of jack is the modular jack which is configured to removably receive an RJ-type plug. Electrical jacks enable the electrical apparatus to be connected with communication lines, such as telephone lines or network lines. In turn, the communication lines permit the electrical apparatus to couple with local or global computer networks and/or directly to other identified electrical apparatus so that information can be transmitted to and/or from the electrical apparatus. Electrical jacks can also be used to couple power to the electrical apparatus and to attach other electrical devices to the apparatus.

It can at times be difficult to ascertain whether a jack and/or the electronics coupled therewith is in operation and/or is in proper condition for operation. Likewise, at times it can also be difficult to determine whether a specific operation or program of the electrical apparatus is active or complete. Although some of these determinations can be made by accessing applicable software or testing applicable hardware, such testing can often be time consuming. Furthermore, testing of hardware is typically impractical to the average user.

Accordingly, what is needed is an easy and quick method by which an average user of an electrical apparatus can determine one or more predetermined operating conditions of the electrical apparatus.

SUMMARY AND OBJECTS OF THE INVENTION

Accordingly, an object of the present invention is to provide a jack system that can be coupled with any type of electrical apparatus and which enables a user to quickly and easily determine one or more predetermined operating conditions of the electrical apparatus. Examples of operating conditions include whether the jack and/or the related plug are properly coupled together or are in some way damaged. Alternatively, the operation condition may be whether the electrical apparatus, select elements thereof, and/or software running thereon are in proper operating condition or are currently in operation. Other operating conditions may be whether the electrical apparatus is fully recharged, is turned on, or is properly coupled with an accessory.

To achieve the forgoing objectives and in accordance with the invention as embodied and broadly disclosed herein, a jack system is provided. The jack system can be mounted on any type of electrical apparatus such as a computer, PC card, or personal information manager. The jack system includes a housing with a socket or receptacle. The housing can be a discrete element, such as a modular jack, or be an integral portion of the electrical apparatus. The socket is configured to receive an electrical plug. In one embodiment, the electrical plug is an RJ-type plug but any suitable connector may be used. Preferably, the electrical plug is at least partially translucent to allow at least some light to be transmitted through the plug. Alternatively, the electrical plug may be generally opaque to block generally all the light or the plug and socket may be configured to allow the light to pass around the plug.

A light source is coupled with the housing so as to selectively illuminate the socket and/or the translucent electrical plug when the translucent electrical plug is received within the socket of the housing. In one embodiment, the light source is a light emitter, such as an LED, mounted on the housing so as to be at least partially exposed to the socket of the housing. In an alternative embodiment, an opening is formed on the housing in communication with the socket. A light emitter is disposed a distance from the opening on the housing. A conduit extends between the light emitter and the opening. The conduit, such as a light pipe or fiber optic cables, is configured to channel light from the light emitter to the opening on the housing, thereby illuminating the socket of the housing. Where the electrical plug is at least partially translucent, illumination of the socket results in illumination of the electrical plug when the plug is received within the socket.

In yet another embodiment, either all or a portion of the housing bounding the socket is made of a translucent material. The translucent portion of the housing is coupled with or integrally formed to one end of the conduit. The resulting housing provides greater light dispersement within the socket. Furthermore, where the entire housing is made of a translucent material, the illuminated housing can still be see even when an opaque plug is received within the socket.

The light emitter can be programmed or otherwise configured to operate under predetermined operating conditions. For example, the socket can be illuminated when the socket is ready to receive a plug. Alternatively, the plug can be illuminated within the socket when the plug is coupled in proper electrical communication with the socket. The illumination of the socket and/or the plug provides a quick and easy determination for the user as to the predetermined operating condition under which the light emitter is to be turned on.

The modular jack of the present invention advantageously allows communications cards to be connected to standard RJ series plugs without deviating from the Type III PC card size and configuration requirements, even if the plug is inserted into the jack. The modular jack also allows communications cards to be interconnected with various electronic devices and communications systems because it is configured to receive standard RJ series plugs. The modular jack also allows communications cards to be quickly, easily and securely connected and disconnected to desired electronic devices and communications systems. This permits the communications cards to be readily used with portable systems or while traveling. Further, the modular jack requires no changes or modifications to the standard RJ series plugs.

One aspect of the present invention is a modular jack that is mounted to a Type III PC card. Significantly, when the plug is received within the jack, no portion of the plug or modular jack violates the Type III PC card height limitation of 10.5 mm.

Another aspect is a modular jack with a receptacle in the front surface of a modular jack. When the plug is inserted into the receptacle, the plug is contained within receptacle and no portion of the plug, including the biased clip, extends through another surface of the modular jack. Significantly, because no portion of the plug protrudes through the upper or lower surfaces of the modular jack when the plug is inserted into the jack, the modular jack and the received plug satisfy the 10.5 mm height limitation of a Type III PC card. Advantageously, because no portion of the biased clip protrudes through the upper or lower surfaces of the modular jack, the clip is less likely to be broken or damaged.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE PREFERRED EMBODIMENTS

The present invention relates to electrical jacks that can be selectively illuminated and/or configured to illuminate an electrical plug coupled therewith so as to identify one or more predetermined operating conditions of the electrical jack and/or electrical apparatus coupled with the jack.

Figure 1:
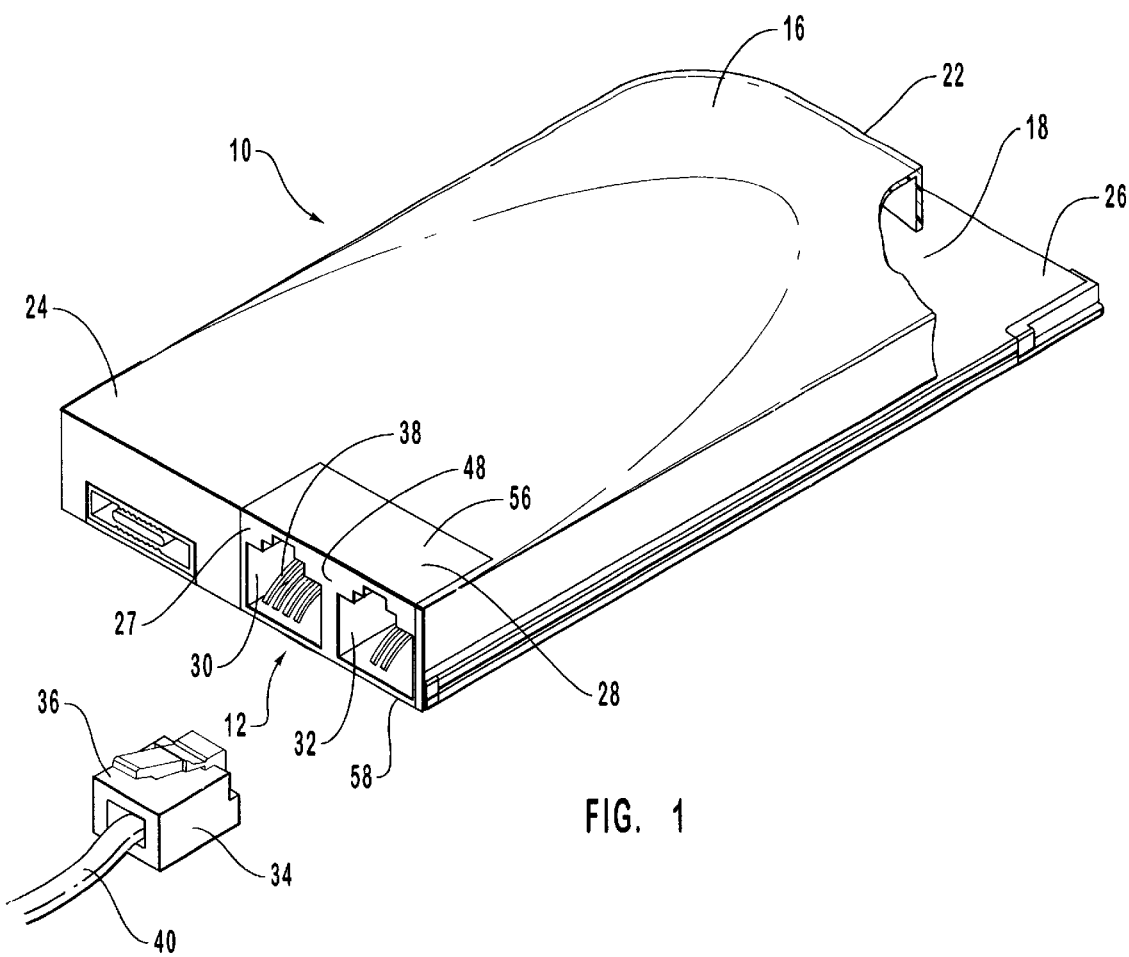
FIG. 1 is a perspective view of a PC card in accordance with a preferred embodiment of the invention.

Depicted in FIG. 1 is a preferred embodiment of a PC card 10 having an electrical jack system 12 incorporating features of the present invention. PC card 10 can be configured in a variety of different form factors and can house electrical circuitry so as to perform a variety of one or more different functions. In the embodiment depicted, PC card has a housing 16 that extends from a first end 22 to an opposing second end 24. Depicted in FIGS. 1 and 2, housing 16 bounds a compartment 18 in which a circuit board 20 is disposed. Located at first end 26 of housing 16 is a conventional 68-pin connector for coupling PC card 10 to a conventional electrical apparatus, such as a personal computer. Desirably the PC card 10 conforms to the Personal Computer Memory Card International Association (PCMCIA) standards or guidelines for a Type III card. Accordingly, the PC card desirably a length of 85.6 mm (3.4 inches), a width of 54.0 mm (2.1 inches), and a height of 10.5 mm (0.4 inches), but it will be appreciated that the card may have other desired sizes and configurations that are suitable for its intended purpose, and the card does not have to conform to any specific standards or guidelines.

Figure 2:
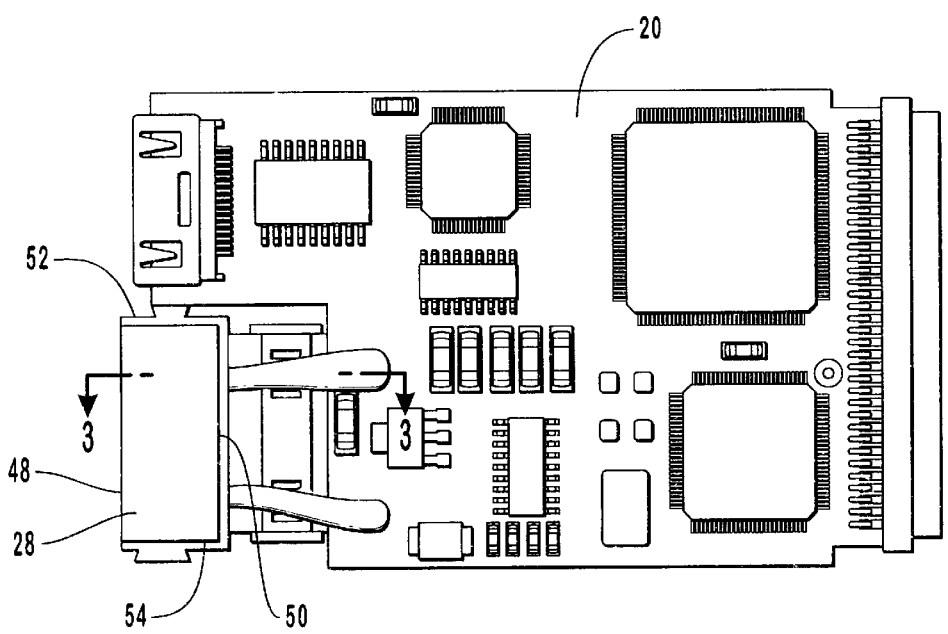
FIG. 2 is a top view of the jack system mounted on the circuit board of the PC card shown in FIG. 1.

Positioned at second end 24 of housing 16 is jack system 12. In the embodiment depicted, the jack system 12 includes a modular jack 27 which in turn comprises a jack housing 28. As depicted in FIGS. 1 and 2, jack housing 28 has a front face 48, a back wall 50, opposing side walls 52, 54, a top wall 56, and an opposing bottom wall 58. Formed within front face 48 of jack housing 28 is a first socket 30 and an adjacent second sockct 32. In alternative embodiments, jack housing 28 can be incorporated into or formed integral with housing 16 and can contain one or more sockets. A preferred embodiment of a modular jack 27 is described in assignee's copending U.S. patent application Ser. No. 09/528,331, filed Mar. 20, 2000, entitled Modular Jack for Type III PCMCIA Communication Cards, which is hereby incorporated by reference in its entirety. In this preferred embodiment, the modular jack 27 has a height of about 10.5 mm measured from the top wall 56 to the bottom wall 58, and the sockets 30, 32 have a height of about 10.1 mm.

The socks 30, 32 located in the modular jack 27 include a main body portion having a generally rectangular cnfiguration with an upper surface, a right side, a left side a front surface and a rear surface. As shiwn in FIG. 1, the upper surface of the modular jack 27 is preferrably generally aligned and substantially planar with the top surface of the housing of the communications card 10. Alternatively, the top surface of the housing may be configured to cover the upper surface of the modular jack 27. The bottom surface of the communications card 10 preferably encloses the lower surface of the modular jack 27 and is generally aligned with a lip located proximate the front surface of the jack. On the other hand, the lower surface of the modular jack 27 may be generally aligned with the bottom surface of the communications card 10. In ant of these configurations, hoewer, the height of the modular jack 27 is the generally equal to or less than the height of the communications card 10. Additionally, as shown in the accompaying figures, the sockets 30, 32 are located entirely in the front surface of the modular jack 27, and the upper surface of the modular jack is solid, planar surface that does not include any opening or cutouts.

Figure 3:
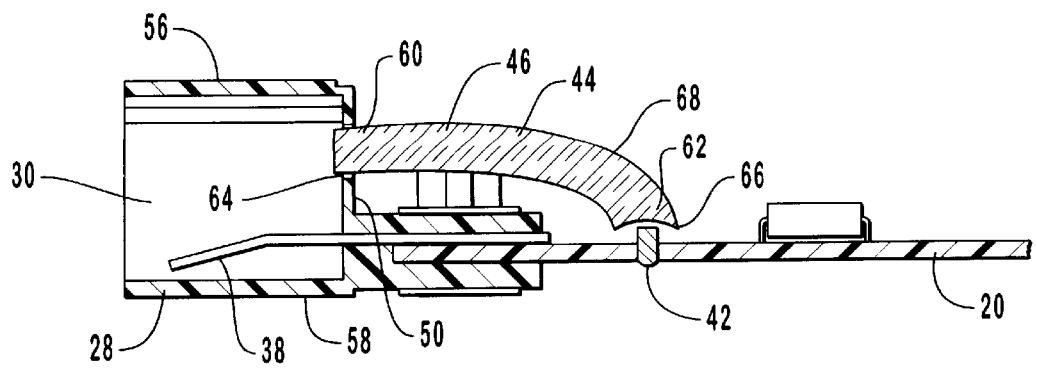
FIG. 3 is a cross sectional side view of the jack system shown in FIG. 2 taken along section line 3—3.
Figure 4:
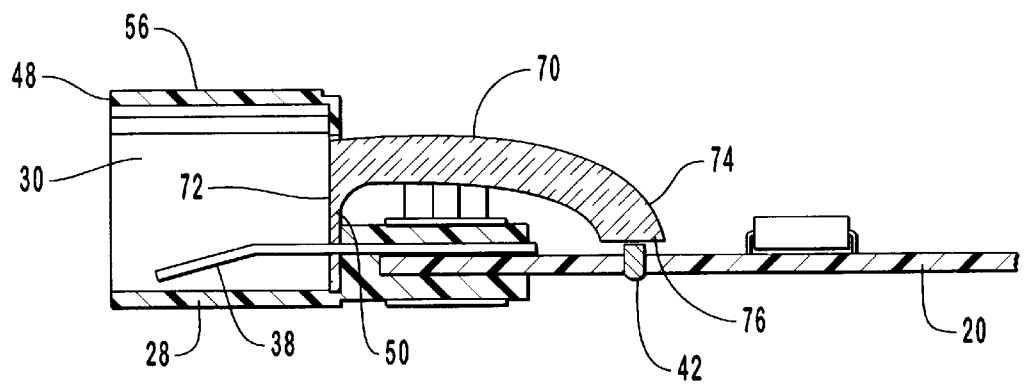
FIG. 4 is a cross sectional side view of another preferred embodiment of the jack system shown in FIG. 3.
Figure 5:
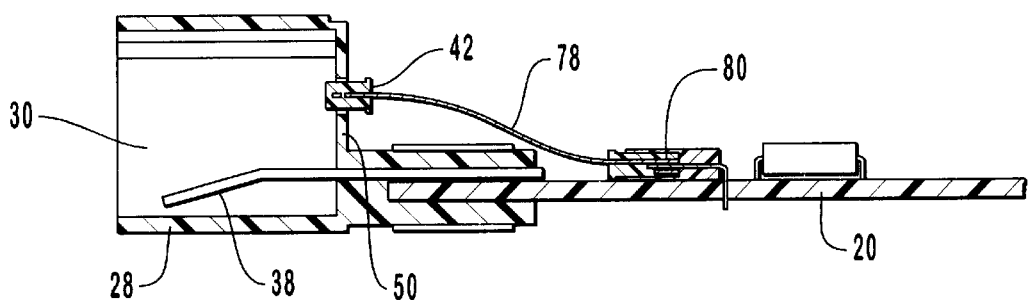
FIG. 5 is a cross sectional side view of still another preferred embodiment of the jack system shown in FIG. 3.

As best seen in FIGS. 3 to 5, the modular jack 27 includes a rearwardly extending connector 90 with a first end 92 attached to the modular jack and an opposing second end 94. The rearwardly extending connector 90 desirably has a length of about 8.7 mm and it is used to electrically connect the modular jack 27 to the circuit board 20. Those skilled in the art will readily appreciate, however, that the modular jack 27 can have a variety of different sizes and configurations depending, for example, upon the type of connectors, intended use of the communications card, size and shape of the communications card, and specific applications of the communications card. A preferred embodiment of connecting the modular jack 27 to a circuit board is disclosed in assignee's copending U.S. patent application Ser. No. 09/528,501, filed Mar. 20, 2000, entitled Card Edge Connector for a Modular Jack, which is hereby incorporated by reference in its entirety.

One or more contacts 28 are located within the sockets 30, 32 of the modular jack 27. Typically, four or six contacts are used in conjunction with an RJ-11 connector and eight contacts are used in conjunction with an RJ-45 connector, but any suitable number of contacts may be utilized. Advantageously, the contacts 38 shown in connection with these preferred embodiments can be used in conjunction with RJ-11 and/or RJ-45 connectors, but one skilled in the art will recognize that the contacts may be manufactured in any of a wide variety of designs and configurations in order to be used with specific applications or connectors. In the illustrated embodiments, the contacts 38 comprise flexible pins that are in electrical communication with circuit board 20. Preferred embodiments of the contact pins are provided in assignee's copending U.S. patent application Ser. No. 09/528,500, filed Mar. 20, 2000, entitled Contact Pin Design for a Modular Jack, which is hereby incorporated by reference it its entirety.

Socket 30 is configured to receive an electrical plug 34. In the embodiment depicted, electrical plug 34 comprises an RJ-type plug, such as an RJ-9, 11, 25, or 45. Plug 34 has a body 36 in electrical communication with a cable 40. Body 36 is typically molded from a plastic material which in one embodiment is at least partially translucent. Plug 34 is configured to couple in electrical communication with contacts 38 when plug 34 is received within socket 30.

The present invention also includes means for illuminating socket 30 of housing 28. By way of example and not by limitation, depicted in FIG. 3, a light emitter 42 is mounted on circuit board 20 a distance from socket 30. In one embodiment, light emitter 42 comprises any LED. In alternative embodiments, light emitter 42 can comprise a filament bulb, a laser, or any other sources capable of emitting light.

A conduit 44 extends between light emitter 42 and socket 30. Conduit 44 is configured to channel light from light emitter 42 to socket 30. In the embodiment depicted, conduit 44 comprises an elongated light pipe 46 having a first end 60, an opposing second end 62, and a curve 68 formed therebetween. In one embodiment, light pipe 46 is formed from a translucent plastic material such as polyethylene, polypropylene, or polystyrene, but one skilled in the art will appreciate that other suitable types of plastics, including elastomers, polymers, polyolefins and the like, or other suitable materials may be used. In alternative embodiment, light pipe 46 can be formed from glass, plastic or other at least partially translucent materials.

The first end 60 of the light pipe 46 is disposed within an opening 64 formed in a back wall 50 of jack housing 28. As such, the light pipe 46 is exposed to the socket 30. The present invention also envisioned that first end 60 can be disposed within an opening formed through side walls 52, 54, top wall 56, and/or bottom wall 58. Furthermore, depending on the desired light intensity, first end 60 of light pipe 46 need not be directly disposed within socket 30 but only aligned with opening 64.

The second end 62 of light pipe 46 has an end face 66 having a substantially concave configuration. End face 66 is disposed over and adjacent to light emitter 42 so as to maximize the amount of light captured from light emitter 42. In alternative embodiments, end face 66 can also be conical, flat, or any other desired configuration.

Light emitter 42 can be located at any desired position relative to jack housing 28. As such, light pipe 46 can also have a variety of different configurations, i.e., straight and/or having one or more curves, to facilitate transfer of light from emitter 42 to socket 30. In one embodiment, as depicted in FIG. 3, light pipe 46 is configured such that the central longitudinal axis extending through second end 62 of light pipe 46 is aligned with light emitter 42. This configuration helps light pipe 46 to maximize the capture and transfer of light. Curves along the length of light pipe 46 are typically smooth and gradual so as to help prevent refraction of light out of light pipe 46 prior to exit through first end 60.

Depicted in FIG. 4 is an alternative embodiment of light pipe 46 depicted in FIG. 3. Like elements in FIGS. 3 and 4 are identified by like reference characters. Depicted in FIG. 4 is a light pipe 70 having an enlarged first end 72 that integrally or connectably forms back wall 50 of housing 28. In this regard, light pipe 70 is potentially capable of emitting light over a larger area within socket 30. The present invention also envisions that first end 72 of light pipe 70 can form a portion of front face 48, side walls 52, 54, top wall 56, and/or bottom wall 58. Where all of jack housing 28 or at least a portion of front face 48 is formed from a translucent material and is coupled with light pipe 70, the translucent portion of front face 48 is illuminated and exposed even when an opaque plug is received within socket 30. Light pipe 70 also has a second end 74 having a substantially flat end face 76.

In contrast to light pipes 46 and 70, alternative conduits 44 include fiber optic materials, tubular piping members, and any other members or materials that will facilitate channeling and transfer of light.

Depicted in FIG. 5 is an alternative embodiment of the means for illuminating socket 30 of housing 28. Depicted in FIG. 5, light emitter 42 is mounted directly on back wall 50 such that light emitted therefrom is directed into socket 30. Light emitter 42 is electrically coupled with circuit board through a flexible cable 78 and a connector 80, such as a ZIF connector. As discussed above, light emitter 42 can comprise an LED or other apparatus configured to emit light. The present invention also envisions that light emitter 42 can be mounted on side walls 52, 54, top wall 56, and/or bottom wall 58.

In one embodiment, the illumination of socket 30 may be sufficiently intense so as to be noticeable during normal use in a lighted room. Alternatively, the intensity may be so minimal that absent viewing directly into socket 30, illumination would not be noticed in a lighted room. The present invention also envisions that in one embodiment, insertion of translucent plug 34 into socket 30 results in the illumination of plug 34.

Although FIGS. 1–5 show modular jack 27 being incorporated into jack system 12, the present invention envisions that a variety of alternative electrical jacks can be incorporated into jack system 12 for selective illumination. For example, such jacks include PC card I/O connectors, pin connectors, USB connectors, fiber optic connectors, and conventional electrical outlets. Of course, corresponding plugs would be used with such jacks. Furthermore, although jack system 12 is discussed above as being used in a PC card, the inventive jack system can be used in any electrical apparatus. For example, such electrical apparatus can include personal information managers, personal computers, network computers, electrical diagnostic apparatus, and any other type of electrical equipment wherein electrical jacks are used.

Figure 6:
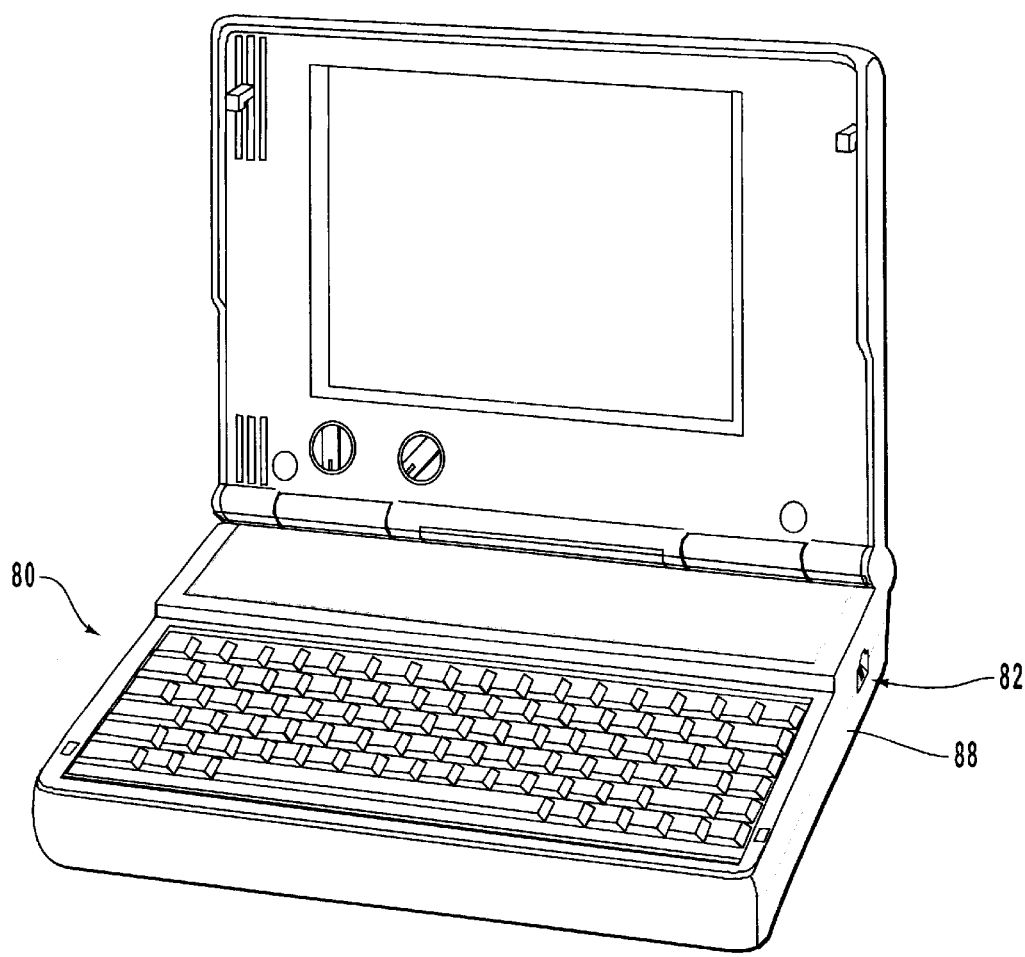
FIG. 6 is a perspective view of a computer including a preferred embodiment of the jack system formed thereon.
Figure 7:
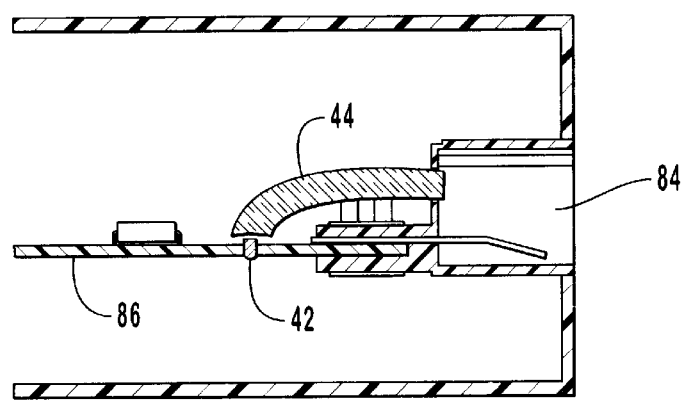
FIG. 7 is a cross sectional side view of the jack system shown in FIG. 6.

By way of example, depicted in FIG. 6 is a personal computer 80 having an inventive jack system 82 incorporated therein. Personal computer 80 includes a housing 88 in which a socket 84 is integrally formed. Socket 84 is configured to receive an RJ-type electrical plug 34 in electrical communication. As depicted in FIG. 7 and as previously discussed with regard to FIG. 3, a light emitter 42 is disposed on a circuit board 86 or other structure positioned within housing 88. Conduit 44 extends between socket 84 and light emitter 42 so as to selectively illuminate socket 84 and/or an electrical plug received therein.

The present invention envisions that the illumination of socket 30, 84 and/or the electrical plug received therein can be used to signify a variety of different things. For example, illumination of a socket and/or plug can be used to designate whether the jack and/or plug are properly connected, whether they are in condition for operation, or whether they are currently in operation. The socket and/or plug can also be illuminated with different colors to designate different stages of operation. Furthermore, the socket and/or plug can also be selectively illuminated to designate what component or software of the electrical apparatus is in operation.

What is claimed and desired to be secured by United States Letters Patent is:

1. An apparatus that allows a RJ series connector plug to be connected to a communications card that conforms to the Personal Computer Memory Card International Association (PCMCIA) requirements for a Type III PC card, the apparatus comprising:

a housing including a first outer surface, an opposing second outer surface, and a front surface, the first outer surface and the second outer surface being separated by a distance of 10.5 mm or less; and a receptacle located in the front surface of the housing that is sized and configured to receive the RJ series connector plug along a generally longitudinal axis such that no portion of the plug extends through either the first outer surface or the second outer surface of the housing when the plug is inserted into the receptacle;

a contact at least partially disposed within the receptacle, the contact being sized and configured to allow electrical communication between the RJ series connector plug and the communications card when the plug is inserted into the receptacle; and means for illuminating the receptacle;

wherein there is no cutout in the first outer surface or the second outer surface of the housing that is configured to allow a biased clip of the plug to protrude through.

2. The apparatus as in claim 1, wherein the first outer surface and the second outer surface of the housing comprise generally solid, planar surfaces that prevent any portion of the RJ series connector plug from extending through the first or second outer surfaces.

3. The apparatus as in claim 1, wherein the housing comprises at least a portion of a modular jack.

4. The apparatus as in claim 1, wherein the housing comprises at least a portion of a housing of a PC card that meets the Type III PCMCIA size and configuration requirements.

5. The apparatus as in claim 1, wherein the housing comprises the housing of a modular jack and the modular jack is mounted to a PC card that meets the Type III PCMCIA size and configuration requirements.

6. The apparatus as in claim 1, wherein the means for illuminating the receptacle comprises a light source mounted on the housing so as to communicate with the socket.

7. The apparatus as in claim 1, wherein the means for illuminating the receptacle comprises a light source positioned a distance from the socket and a conduit extending between the light source and the socket.

8. A communications card conforming to the Personal Computer Memory Card International Association guidelines for a Type III PC card, the communications card comprising:

a housing including a top surface, a bottom surface and a front surface;

a circuit board disposed within the housing, the circuit board including one or more electrical contacts;

a modular jack electrically connected to the circuit board, the modular jack including a first outer surface, a second outer surface and a front surface, the first outer surface and the second outer surface being separated by a distance that is generally equal to or less than about 10.5 mm;

a receptacle disposed in the front surface of the modular jack, the receptacle being sized and configured to receive a RJ series connector plug along a generally longitudinal axis such that no portion of the plug extends through either the first outer surface or the second outer surface of the modular jack when the plug is inserted into the receptacle; and a light source coupled with the receptacle so as to selectively illuminate at least a portion of the RJ series connector plug when it is received within the receptacle;

wherein there is no cutout in the first outer surface or the second outer surface of the modular jack that is configured to allow a biased clip of the plug to protrude through the outer surfaces.

9. The communications card as in claim 8, wherein the light source comprises a light emitting diode (LED) mounted on the receptacle and in communication with the receptacle.

10. The communications card as in claim 8, wherein the light source comprises:

an opening formed in the receptacle;

a light emitter disposed a distance from the opening on the receptacle; and a conduit extending between the light emitter and the opening in the receptacle, the conduit being configured to channel light from the light emitter to the opening on the receptacle.

11. The communications card as in claim 8, wherein the light source comprises:

a light emitting diode (LED) disposed a distance from the receptacle; and a conduit having a first end and an opposing second end, the first end of the conduit forming a portion of the modular jack bounding the receptacle, the second end of the conduit being disposed adjacent to the LED.

12. The communications card as in claim 8, wherein the first outer surface and the second outer surface of the modular jack comprise generally solid planar surfaces that prevent any portion of the RJ series connector plug front extending through the first outer surface or the second outer surface.

13. The communications card as in claim 8, wherein the first outer surface of the modular jack is a generally solid, planar surface that is generally aligned with the top surface of the housing and the second outer surface of the modular jack is a generally solid, planar surface that is generally aligned with the bottom surface of the housing.

14. The communications card as in claim 8, wherein the receptacle includes an upper inner surface and a lower inner surface that are separated by a distance that is generally equal to or less than about 10.1 mm.

15. The communications card as in claim 10, wherein the receptacle is sized and configured to receive a RJ-11 connector plug.

16. The communications card as in claim 10, wherein the conduit comprises a light pipe.

17. The communications card as in claim 11, wherein the conduit comprises a light pipe.

18. An electrical connector comprising:

a communications card including a housing with an upper surface and two side walls, the upper surface and the side walls forming a cavity;

a circuit board disposed within the cavity of the housing;

one or more electrical contacts disposed on the circuit board;

a modular jack coupled to the housing of the communications card, the modular jack including a first outer surface, a second outer surface and a front surface, the first outer surface and the second outer surface being separated by a distance of about 10.5 mm or less, the modular jack being electrically connected to the one or more electrical contacts disposed on the circuit board;

a receptacle in the modular jack that is sized aid configured to receive a RJ series connector plug along a generally longitudinal axis such that no portion of the plug extends through either the first outer surface or the second outer surface of the modular jack when the plug is inserted into the receptacle;

a light emitter disposed in electrical communication with the circuit board; and a conduit having a first end in communication with the light emitter and a second end in communication the receptacle such that at least a portion of the receptacle is capable of being illuminated with light;

wherein the first outer surface and the second outer surface do not include a cutout that is configured to allow a biased clip of the plug to protrude through the outer surfaces.

19. The electrical connector as in claim 18, wherein the light emitter comprises a light emitting diode (LED).

20. The electrical connector as in claim 18, wherein the conduit comprises a light pipe.

21. The electrical connector as in claim 18, wherein the PC card is a Type III PCMCIA card and the modular jack is configured to receive a RJ-type plug.

22. The electrical connector as in claim 18, wherein at least one of the ends of the conduit has a substantially concave face.

23. The electrical connector as in claim 18, wherein the first end of the conduit is aligned with an opening formed in the modular jacks the opening communicating with the receptacle in the modular jack.

24. The electrical connector as in claim 18, wherein the first end of the conduit forms at least a portion of the modular jack bounding the receptacle.

25. The electrical connector as in claim 18, wherein the receptacle of the modular jack is configured to receive a RJ-type plug.

* * * * *